United States Patent
Choi et al.

(10) Patent No.: US 11,469,747 B1
(45) Date of Patent: Oct. 11, 2022

(54) SHIFT REGISTER AND ELECTRONIC DEVICE INCLUDING THE SAME

(71) Applicant: SK hynix Inc., Icheon-si (KR)

(72) Inventors: Geun Ho Choi, Icheon-si (KR); Young Hyun Baek, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/551,653

(22) Filed: Dec. 15, 2021

(30) Foreign Application Priority Data

Sep. 15, 2021 (KR) .......................... 10-2021-0123540

(51) Int. Cl.
 *H03K 5/15* (2006.01)
 *H03K 5/00* (2006.01)

(52) U.S. Cl.
 CPC .................. *H03K 5/15093* (2013.01); *H03K 2005/00286* (2013.01)

(58) Field of Classification Search
 None
 See application file for complete search history.

(56) References Cited

U.S. PATENT DOCUMENTS

| | | | | |
|---|---|---|---|---|
| 3,638,192 A * | 1/1972 | Rutherford | ............ | H04B 14/02 375/373 |
| 5,909,130 A * | 6/1999 | Martin | .................... | H03L 7/095 327/12 |
| 6,775,217 B1 * | 8/2004 | Kato | .................. | G11B 7/00456 |
| 8,310,430 B2 * | 11/2012 | Hiratsuka | ............ | G09G 3/3677 345/100 |
| 2003/0174115 A1 * | 9/2003 | Washio | ................ | G09G 3/3688 345/98 |
| 2004/0150610 A1 * | 8/2004 | Zebedee | ................ | G11C 19/28 345/100 |
| 2005/0156859 A1 * | 7/2005 | Jang | ........................ | G11C 19/28 345/100 |
| 2005/0156865 A1 * | 7/2005 | Suh | ........................ | G09G 3/3685 345/100 |
| 2006/0145732 A1 * | 7/2006 | Hsiao | ........................ | H03L 7/10 327/105 |
| 2006/0256908 A1 * | 11/2006 | Ludwig | ................ | H03D 13/004 375/375 |
| 2009/0289588 A1 * | 11/2009 | Miyagoe | .................. | H02P 25/03 318/473 |
| 2010/0134476 A1 * | 6/2010 | Zebedee | ................ | G11C 19/28 345/55 |
| 2012/0051480 A1 * | 3/2012 | Usugi | ...................... | H03L 7/087 375/376 |

(Continued)

FOREIGN PATENT DOCUMENTS

KR 1020190141499 A 12/2019

*Primary Examiner* — Thomas J. Hiltunen
*Assistant Examiner* — Khareem E Almo
(74) *Attorney, Agent, or Firm* — William Park & Associates Ltd.

(57) ABSTRACT

A shift register generates a synthesized pulse having a different pulse width according to which one of a first phase pulse and a second phase pulse is inputted, generates an internal shifted synthesized pulse and a shifted synthesized pulse from the synthesized pulse, and generates a detection signal by detecting a pulse width of the internal shifted synthesized pulse. The shift register outputs the shifted synthesized pulse as one of a first shifted phase pulse and a second shifted phase pulse based on the detection signal.

20 Claims, 12 Drawing Sheets

(56) References Cited

U.S. PATENT DOCUMENTS

| | | | |
|---|---|---|---|
| 2012/0146978 A1* | 6/2012 | Park | G11C 19/287 377/64 |
| 2012/0154001 A1* | 6/2012 | Seo | H03L 7/0814 327/158 |
| 2013/0082615 A1* | 4/2013 | Williams | H05B 45/52 315/186 |
| 2013/0099702 A1* | 4/2013 | Williams | H05B 47/18 315/363 |
| 2014/0064439 A1* | 3/2014 | Qing | G09G 3/3674 377/75 |
| 2014/0093028 A1* | 4/2014 | Wu | G11C 19/28 377/64 |
| 2018/0122439 A1 | 5/2018 | Bell et al. | |
| 2021/0065829 A1* | 3/2021 | Feng | G09G 3/3655 |
| 2021/0201806 A1* | 7/2021 | Feng | G11C 19/28 |

\* cited by examiner

SHIFT REGISTER AND ELECTRONIC DEVICE INCLUDING THE SAME

CROSS-REFERENCE TO RELATED APPLICATION

The present application claims priority under 35 U.S.C. § 119(a) to Korean application number 10-2021-0123540, filed in the Korean Intellectual Property Office on Sep. 15, 2021, the entire disclosure of which is incorporated herein by reference in its entirety.

BACKGROUND

1. Technical Field

The present disclosure relates to a shift register and an electronic device including the same.

2. Related Art

An electronic device may use clocks having different phases to perform a stable operation even at a high operating speed. The electronic device may include a shift register which shifts signals inputted in synchronization with clocks having different phases.

SUMMARY

Some examples of the present disclosure are directed to a shift register and an electronic device including the same.

In an embodiment, a shift register may include: a synthesized pulse generation circuit configured to generate a synthesized pulse having a different pulse width according to which one of a first phase pulse and a second phase pulse is inputted; a shifted synthesized pulse generation circuit configured to generate an internal shifted synthesized pulse and a shifted synthesized pulse from the synthesized pulse; a pulse width detection circuit configured to generate a detection signal by detecting a pulse width of the internal shifted synthesized pulse; and a shifted pulse output circuit configured to output the shifted synthesized pulse as one of a first shifted phase pulse and a second shifted phase pulse based on the detection signal.

In an embodiment, an electronic device may include a phase pulse generation circuit configured to generate one of a first phase pulse and a second phase pulse depending on a phase of an operation control pulse. The electronic device may also include a shift register configured to: generate a synthesized pulse having a different pulse width according to which one of the first phase pulse and the second phase pulse is inputted; generate an internal shifted synthesized pulse by shifting the synthesized pulse; and generate one of a first shifted phase pulse and a second shifted phase pulse depending on a pulse width of the internal shifted synthesized pulse.

According to some examples of the present disclosure, by synthesizing input pulses to share shift registers which shift input pulses having different phases and shifting a synthesized pulse by adjusting a pulse width thereof according to a phase of an input pulse to distinguish the phase of the input pulse, it is possible to reduce an area and power consumed by the shift register.

DETAILED DESCRIPTION

In the following descriptions of embodiments, the term "preset" indicates that the numerical value of a parameter is previously decided, when the parameter is used in a process or algorithm. According to different embodiments, the numerical value of the parameter may be set before or when the process or algorithm is started or while the process or algorithm is performed.

Terms such as "first" and "second," which are used to distinguish among various components and not to imply a number or order of the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

"Logic high level" and "logic low level" are used to describe the logic levels of signals. A signal having "logic high level" is distinguished from a signal having "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the teachings of the present disclosure will be described in more detail through embodiments. These embodiments are only used to exemplify the teachings of the present disclosure, and the scope of protection of the present disclosure is not limited by the embodiments.

Figure 1:
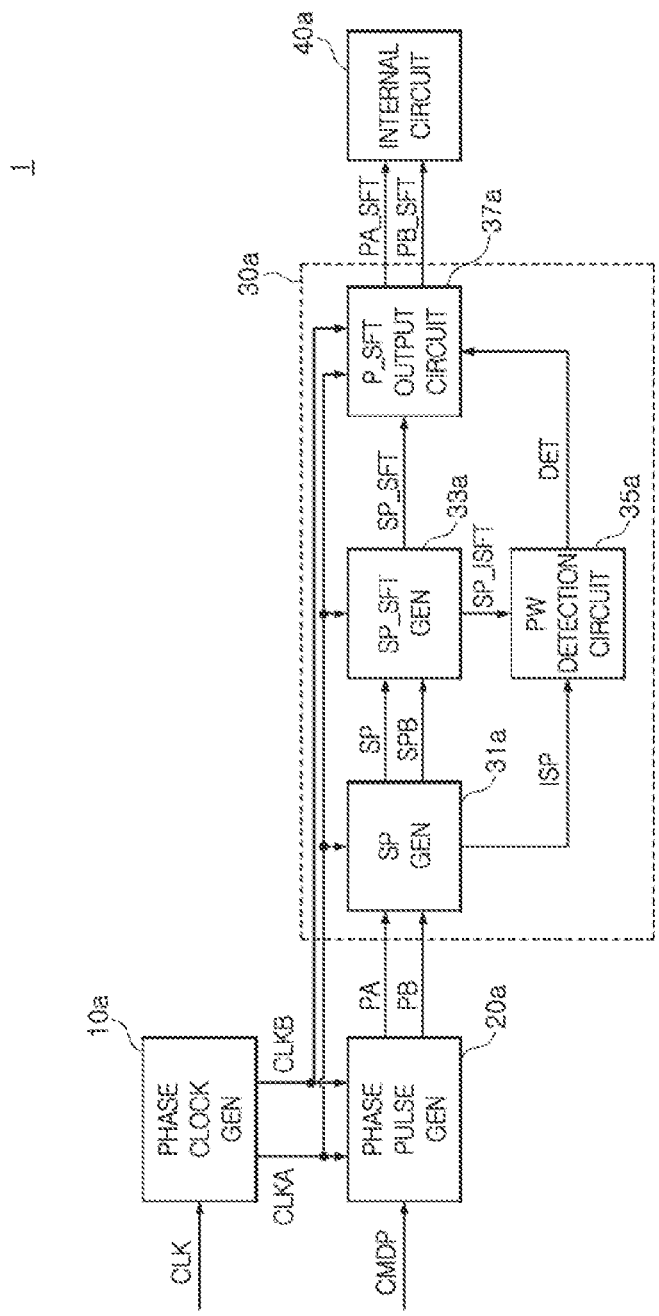
FIG. 1 is a block diagram illustrating a configuration of an electronic device in accordance with an example of the present disclosure.

FIG. 1 is a block diagram illustrating a configuration of an electronic device 1 in accordance with an example of the present disclosure. As illustrated in FIG. 1, the electronic device 1 may include a phase clock generation circuit (PHASE CLOCK GEN) 10a, a phase pulse generation circuit (PHASE PULSE GEN) 20a, a shift register 30a, and an internal circuit (INTERNAL CIRCUIT) 40a. The electronic device 1 may perform various internal operations on the basis of a clock CLK and an operation control pulse CMDP. The electronic device 1 may be applied with the clock CLK and the operation control pulse CMDP from an external device (not illustrated). For an embodiment, the term "clock" refers to a clock signal.

The phase clock generation circuit 10a may generate a first phase clock CLKA and a second phase clock CLKB on the basis of the clock CLK. The phase clock generation circuit 10a may generate the first phase clock CLKA and the second phase clock CLKB by dividing the frequency of the clock CLK. For example, the phase clock generation circuit 10a may generate the first phase clock CLKA and the second phase clock CLKB by dividing the frequency of the clock CLK in half. The first phase clock CLKA and the second phase clock CLKB may have different phases. For example, the first phase clock CLKA and the second phase clock CLKB may have a phase difference of 180 degrees. The operation of the phase clock generation circuit 10a will be described later in detail with reference to FIG. 2.

The phase pulse generation circuit 20a may generate a first phase pulse PA and a second phase pulse PB from the operation control pulse CMDP on the basis of the first phase clock CLKA and the second phase clock CLKB. The phase pulse generation circuit 20a may generate one of the first phase pulse PA and the second phase pulse PB in synchronization with any one of the first phase clock CLKA and the second phase clock CLKB depending on the phase of the operation control pulse CMDP. For example, the phase pulse generation circuit 20a may generate the first phase pulse PA when the operation control pulse CMDP is synchronized with the first phase clock CLKA. The phase pulse generation circuit 20a may generate the second phase pulse PB when the operation control pulse CMDP is synchronized with the second phase clock CLKB. The first phase pulse PA may have the same phase as the first phase clock CLKA. The second phase pulse PB may have the same phase as the second phase clock CLKB. The first phase pulse PA and the second phase pulse PB may have the same predetermined pulse width. The predetermined pulse width may be variously set depending on an embodiment. For example, each of the first phase pulse PA and the second phase pulse PB may have a pulse width corresponding to two cycles of the clock CLK.

The shift register 30a may include a synthesized pulse generation circuit (SP GEN) 31a, a shifted synthesized pulse generation circuit (SP_SFT GEN) 33a, a pulse width detection circuit (PW DETECTION CIRCUIT) 35a, and a shifted pulse output circuit (P_SFT OUTPUT CIRCUIT) 37a. The shift register 30a may generate a first shifted phase pulse PA_SFT and a second shifted phase pulse PB_SFT from the first phase pulse PA and the second phase pulse PB on the basis of the first phase clock CLKA and the second phase clock CLKB. The shift register 30a may output the first shifted phase pulse PA_SFT synchronized with the first phase clock CLKA, by shifting the first phase pulse PA. The shift register 30a may output the second shifted phase pulse PB_SFT synchronized with the second phase clock CLKB, by shifting the second phase pulse PB.

The shift register 30a may generate one of the first phase pulse PA and the second phase pulse PB as a synthesized pulse SP in synchronization with the first phase clock CLKA. The shift register 30a may generate the synthesized pulse SP having a different pulse width depending on which one of the first phase pulse PA and the second phase pulse PB is inputted. The shift register 30a may generate the synthesized pulse SP having the predetermined pulse width when the first phase pulse PA is inputted. The shift register 30a may generate the synthesized pulse SP having a pulse width different from the predetermined pulse width when the second phase pulse PB is inputted.

The shift register 30a may generate an internal shifted synthesized pulse SP_ISFT by shifting the synthesized pulse SP in synchronization with the first phase clock CLKA. The shift register 30a may generate a shifted synthesized pulse SP_SFT by adjusting the pulse width of the internal shifted synthesized pulse SP_ISFT to the predetermined pulse width.

The shift register 30a may output the shifted synthesized pulse SP_SFT as one of the first shifted phase pulse PA_SFT and the second shifted phase pulse PB_SFT depending on the result of detecting the pulse width of the internal shifted synthesized pulse SP_ISFT. When the pulse width of the internal shifted synthesized pulse SP_ISFT is the same as the predetermined pulse width, the shift register 30a may output the shifted synthesized pulse SP_SFT as the first shifted phase pulse PA_SFT in synchronization with the first phase clock CLKA. When the pulse width of the internal shifted synthesized pulse SP_ISFT is different from the predetermined pulse width, the shift register 30a may output the shifted synthesized pulse SP_SFT as the second shifted phase pulse PB_SFT in synchronization with the second phase clock CLKB. Accordingly, the shift register 30a may share circuits for shifting the phase pulses PA and PB having different phases, thereby being capable of reducing the area and power consumed when shifting the phase pulses PA and PB.

The synthesized pulse generation circuit 31a may generate an internal synthesized pulse ISP, an inverted synthesized pulse SPB, and the synthesized pulse SP on the basis of the first phase pulse PA and the second phase pulse PB in synchronization with the first phase clock CLKA. The synthesized pulse generation circuit 31a may generate the internal synthesized pulse ISP from one of the first phase pulse PA and the second phase pulse PB in synchronization with the first phase clock CLKA. The synthesized pulse generation circuit 31a may generate the inverted synthesized pulse SPB and the synthesized pulse SP from the internal synthesized pulse ISP. That is to say, the synthesized pulse generation circuit 31a may output one of the first phase pulse PA and the second phase pulse PB as the synthesized pulse SP in synchronization with the first phase clock CLKA. The synthesized pulse generation circuit 31a may generate the synthesized pulse SP having a different pulse width depending on which one of the first phase pulse PA and the second phase pulse PB is inputted. The synthesized pulse generation circuit 31a may generate the synthesized pulse SP having the predetermined pulse width when the first phase pulse PA is inputted. For example, when the first phase pulse PA is inputted, the synthesized pulse generation circuit 31a may generate the synthesized pulse SP having a pulse width corresponding to two cycles of the clock CLK. The synthesized pulse generation circuit 31a may generate the synthesized pulse SP having a pulse width different from the predetermined pulse width when the second phase pulse PB is inputted. For example, when the second phase pulse PB is inputted, the synthesized pulse generation circuit 31a may generate the synthesized pulse SP having a pulse width corresponding to four cycles of the clock CLK. The configuration and operation method of the synthesized pulse generation circuit 31a will be described later in detail with reference to FIG. 3.

The shifted synthesized pulse generation circuit 33a may generate the internal shifted synthesized pulse SP_ISFT and the shifted synthesized pulse SP_SFT from the synthesized pulse SP on the basis of the inverted synthesized pulse SPB in synchronization with the first phase clock CLKA. The shifted synthesized pulse generation circuit 33a may generate the internal shifted synthesized pulse SP_ISFT by shifting the synthesized pulse SP in synchronization with the first phase clock CLKA. The shifted synthesized pulse generation circuit 33a may generate the shifted synthesized pulse SP_SFT by adjusting the pulse width of the internal shifted synthesized pulse SP_ISFT to the predetermined pulse width on the basis of the inverted synthesized pulse SPB. For example, the shifted synthesized pulse generation circuit 33a may output the shifted synthesized pulse SP_SFT by adjusting the pulse width of the internal shifted synthesized pulse SP_ISFT to two cycles of the clock CLK on the basis of the inverted synthesized pulse SPB. The configuration and operation method of the shifted synthesized pulse generation circuit 33a will be described later in detail with reference to FIG. 4.

The pulse width detection circuit 35a may generate a detection signal DET by detecting the pulse width of the internal shifted synthesized pulse SP_ISFT on the basis of the internal synthesized pulse ISP. The pulse width detection circuit 35a may activate the detection signal DET when the pulse width of the internal shifted synthesized pulse SP_ISFT is different from the predetermined pulse width. For example, the pulse width detection circuit 35a may activate the detection signal DET when the pulse width of the internal shifted synthesized pulse SP_ISFT is four cycles of the clock CLK. The pulse width detection circuit 35a may deactivate the detection signal DET when the pulse width of the internal shifted synthesized pulse SP_ISFT is the same as the predetermined pulse width. For example, the pulse width detection circuit 35a may deactivate the detection signal DET when the pulse width of the internal shifted synthesized pulse SP_ISFT is two cycles of the clock CLK. The configuration and operation method of the pulse width detection circuit 35a will be described later in detail with reference to FIGS. 5 and 6.

The shifted pulse output circuit 37a may output the shifted synthesized pulse SP_SFT as one of the first shifted phase pulse PA_SFT and the second shifted phase pulse PB_SFT on the basis of the detection signal DET in synchronization with the first phase clock CLKA and the second phase clock CLKB. When the detection signal DET is deactivated, the shifted pulse output circuit 37a may output the shifted synthesized pulse SP_SFT as the first shifted phase pulse PA_SFT in synchronization with the first phase clock CLKA. When the detection signal DET is activated, the shifted pulse output circuit 37a may output the shifted synthesized pulse SP_SFT as the second shifted phase pulse PB_SFT in synchronization with the second phase clock CLKB. The configuration and operation method of the shifted pulse output circuit 37a will be described later in detail with reference to FIG. 7.

The internal circuit 40a may perform various internal operations on the basis of the first shifted phase pulse PA_SFT and the second shifted phase pulse PB_SFT.

Figure 2:
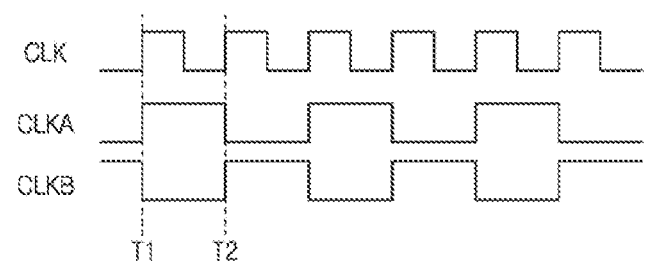
FIG. 2 is a timing diagram for describing the operation of a phase clock generation circuit illustrated in FIG. 1.

FIG. 2 is a timing diagram for describing the operation of the phase clock generation circuit 10a illustrated in FIG. 1. Referring to FIG. 2, the phase clock generation circuit 10a may generate the first phase clock CLKA and the second phase clock CLKB by dividing the frequency of the clock CLK in half. The phase clock generation circuit 10a may generate the first phase clock CLKA which rises at a first rising edge T1 of the clock CLK. The phase clock generation circuit 10a may generate the second phase clock CLKB which rises at a second rising edge T2 of the clock CLK.

Figure 3:
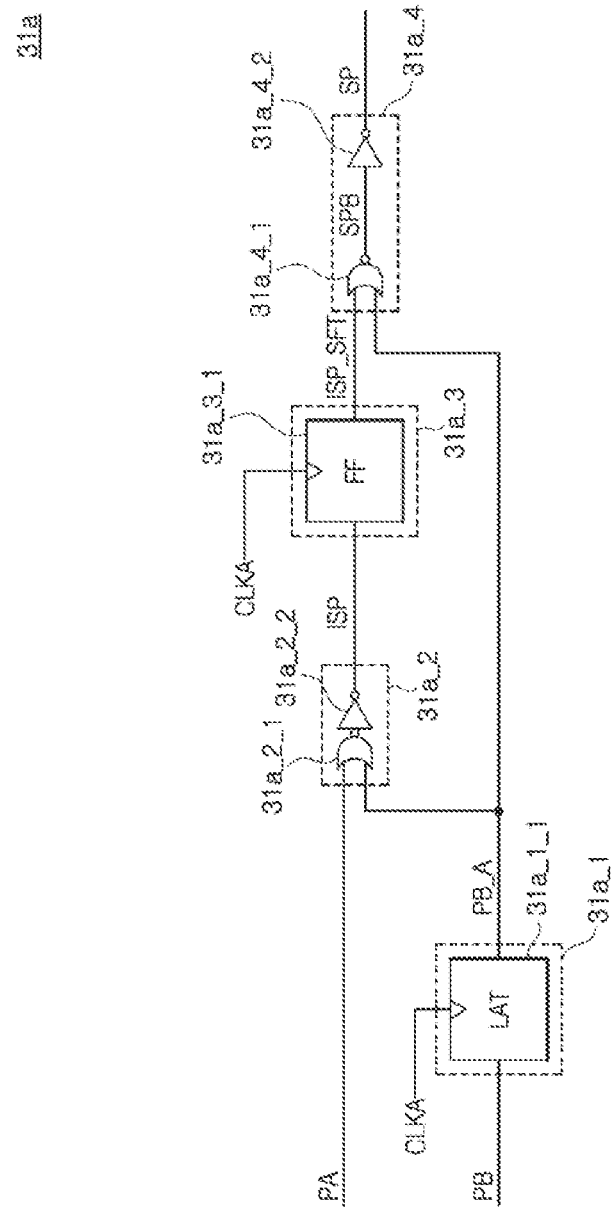
FIG. 3 is a circuit diagram illustrating an example of a synthesized pulse generation circuit included in a shift register illustrated in FIG. 1.

FIG. 3 is a circuit diagram illustrating an example of the synthesized pulse generation circuit 31a included in the shift register 30a illustrated in FIG. 1. As illustrated in FIG. 3, the synthesized pulse generation circuit 31a may include a phase-shifted pulse generation circuit 31a_1, an internal synthesized pulse generation circuit 31a_2, a shift circuit 31a_3, and a synthesized pulse output circuit 31a_4.

The phase-shifted pulse generation circuit 31a_1 may output the second phase pulse PB as a phase-shifted pulse PB_A in synchronization with the first phase clock CLKA. The phase-shifted pulse PB_A may have the predetermined pulse width. The phase-shifted pulse generation circuit 31a_1 may be implemented with a latch circuit (LAT) 31a_1_1 which shifts the second phase pulse PB by one half cycle of the first phase clock CLKA.

The Internal synthesized pulse generation circuit 31a_2 may generate the internal synthesized pulse ISP from one of the phase-shifted pulse PB_A and the first phase pulse PA. The internal synthesized pulse ISP may have the predetermined pulse width. The internal synthesized pulse generation circuit 31a_2 may activate the internal synthesized pulse ISP when one of the phase-shifted pulse PB_A and the first phase pulse PA is activated. The internal synthesized pulse generation circuit 31a_2 may be implemented with a NOR gate 31a_2_1 and an inverter 31a_2_2.

The shift circuit 31a_3 may output a shifted internal synthesized pulse ISP_SFT by shifting the internal synthesized pulse ISP in synchronization with the first phase clock CLKA. The shifted internal synthesized pulse ISP_SFT may have the predetermined pulse width. The shift circuit 31a_3 may be implemented with a flip-flop (FF) 31a_3_1 which shifts the internal synthesized pulse ISP by one cycle of the first phase clock CLKA.

The synthesized pulse output circuit 31a_4 may output the synthesized pulse SP by synthesizing the phase-shifted pulse PB_A and the shifted internal synthesized pulse ISP_SFT. When the phase-shifted pulse PB_A is deactivated, the synthesized pulse output circuit 31a_4 may output the shifted internal synthesized pulse ISP_SFT having the predetermined pulse width as the synthesized pulse SP. In other words, when the phase-shifted pulse PB_A is deactivated, the synthesized pulse SP may have the predetermined pulse width. For example, when the phase-shifted pulse PB_A is deactivated, the synthesized pulse SP may have a pulse width corresponding to two cycles of the clock CLK. When the phase-shifted pulse PB_A is activated, the synthesized pulse output circuit 31a_4 may output the synthesized pulse SP by synthesizing the phase-shifted pulse PB_A and the shifted internal synthesized pulse ISP_SFT. In other words, when the phase-shifted pulse PB_A is activated, the synthesized pulse SP may have a pulse width different from the predetermined pulse width. For example, when the phase-shifted pulse PB_A is activated, the synthesized pulse SP may have a pulse width corresponding to four cycles of the clock CLK. The synthesized pulse output circuit 31a_4 may include a NOR gate 31a_4_1 and an inverter 31a_4_2. During a period in which the phase-shifted pulse PB_A is deactivated to a logic low level, the NOR gate 31a_4_1 may output the inverted synthesized pulse SPB by inverting and buffering the shifted internal synthesized pulse ISP_SFT. During a period in which the phase-shifted pulse PB_A is activated to a logic high level, the NOR gate 31a_4_1 may generate the inverted synthesized pulse SPB having a logic low level. The inverter 31a_4_2 may output the synthesized pulse SP by inverting and buffering the inverted synthesized pulse SPB.

Figure 4:
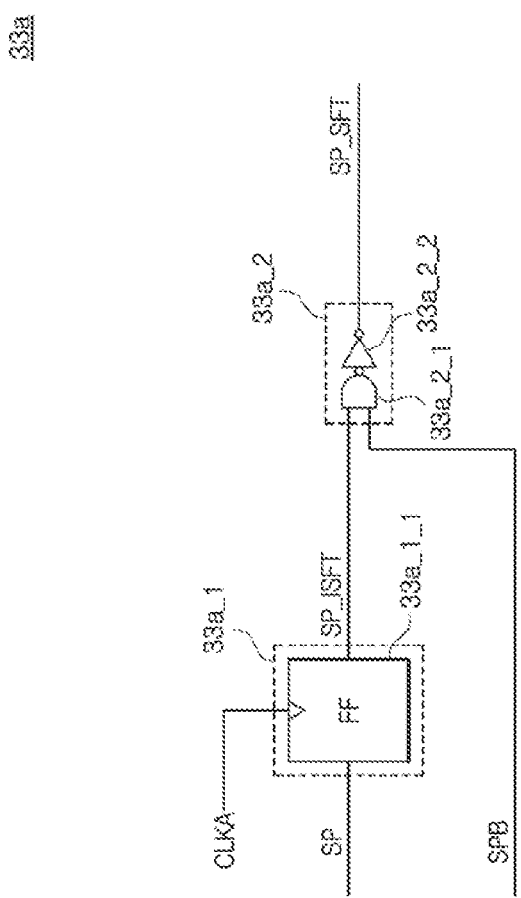
FIG. 4 is a circuit diagram illustrating an example of a shifted synthesized pulse generation circuit included in the shift register illustrated in FIG. 1.

FIG. 4 is a circuit diagram illustrating an example of the shifted synthesized pulse generation circuit 33a included in the shift register 30a illustrated in FIG. 1. As illustrated in FIG. 4, the shifted synthesized pulse generation circuit 33a may include a shift circuit 33a_1 and a pulse width adjustment circuit 33a_2.

The shift circuit 33a_1 may output the internal shifted synthesized pulse SP_ISFT by shifting the synthesized pulse SP in synchronization with the first phase clock CLKA. The shift circuit 33a_1 may include a flip-flop (FF) 33a_1_1 which shifts the synthesized pulse SP by one cycle of the first phase clock CLKA.

The pulse width adjustment circuit 33a_2 may output the shifted synthesized pulse SP_SFT by adjusting the pulse width of the internal shifted synthesized pulse SP_ISFT to the predetermined pulse width on the basis of the inverted synthesized pulse SPB. For example, the pulse width adjustment circuit 33a_2 may adjust the pulse width of the internal shifted synthesized pulse SP_ISFT by blocking the input of the internal shifted synthesized pulse SP_ISFT during a period in which the inverted synthesized pulse SPB has a logic low level and by outputting the internal shifted synthesized pulse SP_ISFT as the shifted synthesized pulse SP_SFT during a period in which the inverted synthesized pulse SPB has a logic high level. The pulse width adjustment circuit 33a_2 may be implemented with a NAND gate 33a_2_1 and an inverter 33a_2_2.

Figure 5:
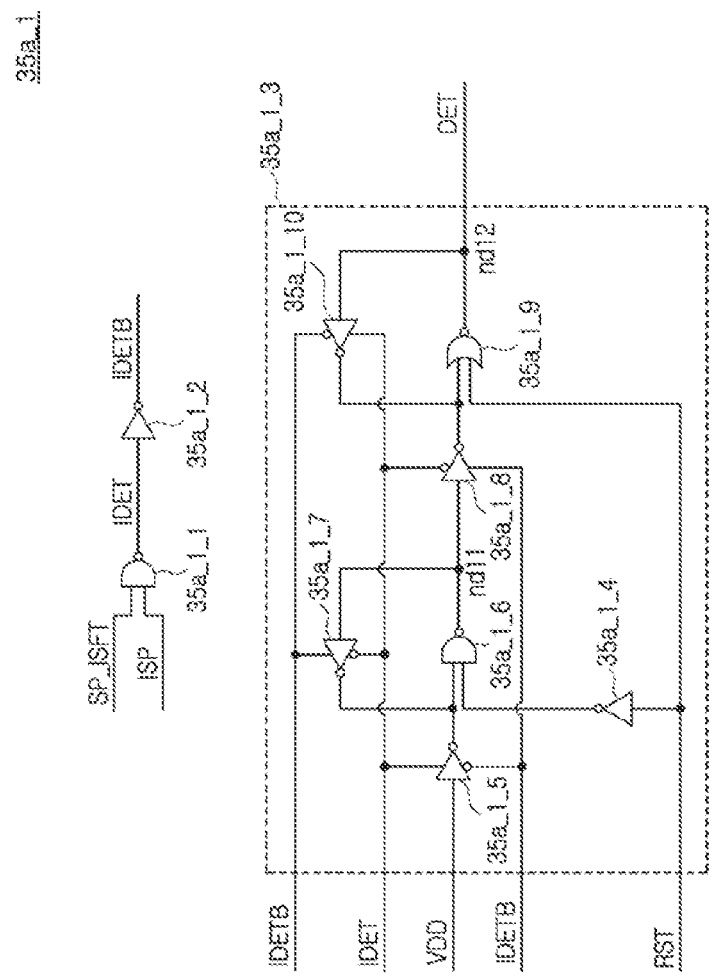
FIG. 5 is a circuit diagram illustrating an example of a pulse width detection circuit included in the shift register illustrated in FIG. 1.

FIG. 5 is a circuit diagram illustrating an example of the pulse width detection circuit 35a included in the shift register 30a illustrated in FIG. 1. As illustrated in FIG. 5, a pulse width detection circuit 35a_1 may include a NAND gate 35a_1_1, an inverter 35a_1_2 and a flip-flop 35a_1_3.

The pulse width detection circuit 35a_1 may generate the detection signal DET on the basis of the internal synthesized pulse ISP and the internal shifted synthesized pulse SP_ISFT. The pulse width detection circuit 35a_1 may generate an internal detection signal IDET according to whether the internal shifted synthesized pulse SP_ISFT is activated during a period in which the internal synthesized pulse ISP is activated. In more detail, the pulse width detection circuit 35a_1 may activate the internal detection signal IDET when the internal shifted synthesized pulse SP_ISFT is activated during a period in which the internal synthesized pulse ISP is activated. The pulse width detection circuit 35a_1 may deactivate the internal detection signal IDET when the internal shifted synthesized pulse SP_ISFT is deactivated during a period in which the internal synthesized pulse ISP is activated. The pulse width detection circuit 35a_1 may activate the detection signal DET when the internal detection signal IDET is activated.

The NAND gate 35a_1_1 may generate the internal detection signal IDET having a logic low level when both the internal shifted synthesized pulse SP_ISFT and the internal synthesized pulse ISP are logic high levels. The inverter 35a_1_2 may output an inverted internal detection signal IDETB by inverting and buffering the internal detection signal IDET. The flip-flop 35a_1_3 may generate the detection signal DET from a power supply voltage VDD in synchronization with the internal detection signal IDET and the inverted internal detection signal IDETB on the basis of a reset signal RST. The reset signal RST may be activated to a logic high level during an initialization operation. The power supply voltage VDD may be applied from a power pad (not illustrated). When the internal detection signal IDET is at a logic high level and the inverted internal detection signal IDETB is at a logic low level, the flip-flop 35a_1_3 may drive an internal node nd11 to a logic high level by the power supply voltage VDD. When the internal detection signal IDET is at a logic low level and the inverted internal detection signal IDETB is at a logic high level, the flip-flop 35a_1_3 may output the detection signal DET by driving an internal node nd12 to a logic high level by the internal node nd11. The flip-flop 35a_1_3 may initialize the internal node nd11 and the internal node nd12 to a logic high level and a logic low level, respectively, when the reset signal RST is activated. The flip-flop 35a_1_3 may be implemented with inverters 35a_1_4, 35a_1_5, 35a_1_7, 35a_1_8, and 35a_1_10; a NAND gate 35a_1_6; and a NOR gate 35a_1_9.

Figure 6:
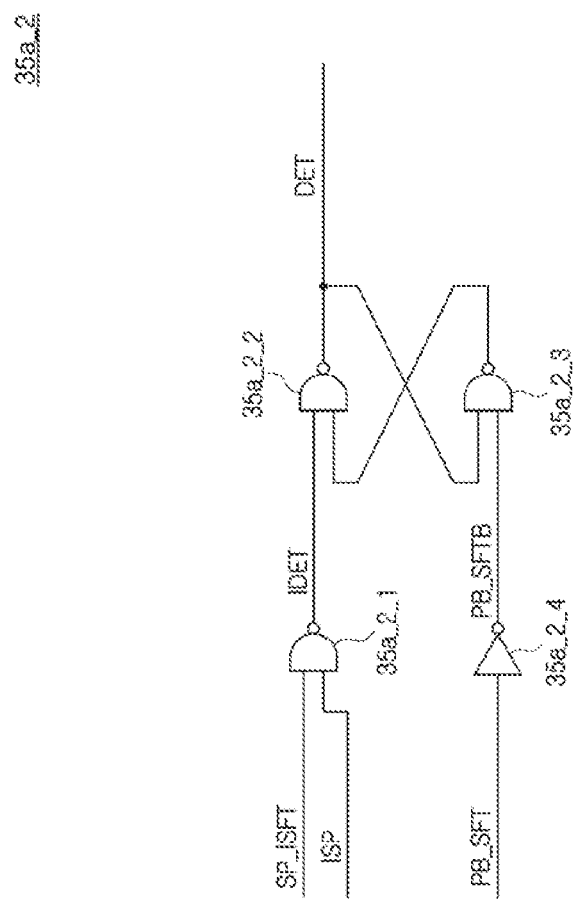
FIG. 6 is a circuit diagram illustrating another example of the pulse width detection circuit included in the shift register illustrated in FIG. 1.

FIG. 6 is a circuit diagram illustrating another example of the pulse width detection circuit 35a included in the shift register 30a illustrated in FIG. 1. As illustrated in FIG. 6, a pulse width detection circuit 35a_2 may include NAND gates 35a_2_1, 35a_2_2, and 35a_2_3 and an inverter 35a_2_4.

The pulse width detection circuit 35a_2 may generate the detection signal DET on the basis of the internal synthesized pulse ISP, the internal shifted synthesized pulse SP_ISFT, and the second shifted phase pulse PB_SFT. The pulse width detection circuit 35a_2 may receive the second shifted phase pulse PB_SFT from the shifted pulse output circuit 37a (see FIG. 1). The pulse width detection circuit 35a_2 may generate an internal detection signal IDET according to whether the internal shifted synthesized pulse SP_ISFT is activated during a period in which the internal synthesized pulse ISP is activated. The pulse width detection circuit 35a_2 may activate the detection signal DET when the internal detection signal IDET is activated. The pulse width detection circuit 35a_2 may deactivate the activated detection signal DET when the second shifted phase pulse PB_SFT is activated.

The NAND gate 35a_2_1 may generate the internal detection signal IDET having a logic low level when both the internal shifted synthesized pulse SP_ISFT and the internal synthesized pulse ISP are at logic high levels. The NAND gates 35a_2_2 and 35a_2_3 may activate the detection signal DET to a logic high level when the internal detection signal IDET is at a logic low level. The inverter 35a_2_4 may invert and buffer the second shifted phase pulse PB_SFT and thereby output an inverted second shifted phase pulse PB_SFTB. The NAND gates 35a_2_2 and 35a_2_3 may deactivate the detection signal DET to a logic low level when the inverted second shifted phase pulse PB_SFTB is at a logic low level.

Figure 7:
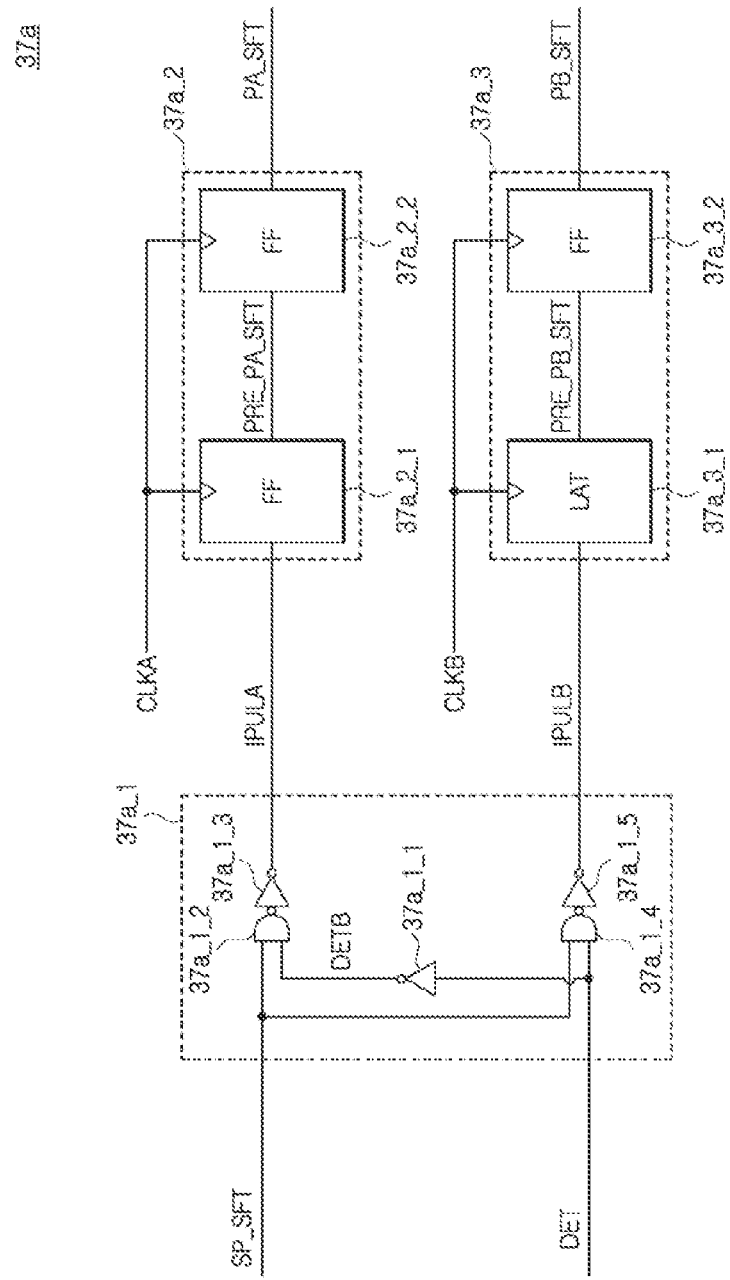
FIG. 7 is a circuit diagram illustrating an example of a shifted pulse output circuit included in the shift register illustrated in FIG. 1.

FIG. 7 is a circuit diagram illustrating an example of the shifted pulse output circuit 37a included in the shift register 30a illustrated in FIG. 1. As illustrated in FIG. 7, the shifted pulse output circuit 37a may include a selective output circuit 37a_1, a first shifted phase pulse output circuit 37a_2, and a second shifted phase pulse output circuit 37a_3.

The selective output circuit 37a_1 may output the shifted synthesized pulse SP_SFT as one of a first internal pulse IPULA and a second internal pulse IPULB on the basis of the detection signal DET. When the detection signal DET is deactivated, the selective output circuit 37a_1 may output the shifted synthesized pulse SP_SFT as the first internal pulse IPULA. When the detection signal DET is activated, the selective output circuit 37a_1 may output the shifted synthesized pulse SP_SFT as the second internal pulse IPULB. The selective output circuit 37a_1 may include inverters 37a_1_1, 37a_1_3, and 37a_1_5 and NAND gates 37a_1_2 and 37a_1_4. The inverter 37a_1_1 may generate an inverted detection signal DETB by inverting and buffering the detection signal DET. When the inverted detection signal DETB is at a logic high level, the NAND gate 37a_1_2 and the inverter 37a_1_3 may output the first internal pulse IPULA by buffering the shifted synthesized pulse SP_SFT. When the detection signal DET is at a logic high level, the NAND gate 37a_1_4 and the inverter 37a_1_5 may output the second internal pulse IPULB by buffering the shifted synthesized pulse SP_SFT.

The first shifted phase pulse output circuit 37a_2 may output the first internal pulse IPULA as the first shifted phase pulse PA_SFT in synchronization with the first phase clock CLKA. The first shifted phase pulse output circuit 37a_2 may include flip-flops (FF) 37a_2_1 and 37a_2_2. The flip-flop 37a_2_1 may output a first pre-shifted phase pulse PRE_PA_SFT by shifting the first internal pulse IPULA by one cycle of the first phase clock CLKA. The flip-flop 37a_2_2 may output the first shifted phase pulse PA_SFT by shifting the first pre-shifted phase pulse PRE_PA_SFT by one cycle of the first phase clock CLKA.

The second shifted phase pulse output circuit 37a_3 may output the second internal pulse IPULB as the second shifted phase pulse PB_SFT in synchronization with the second phase clock CLKB. The second shifted phase pulse output circuit 37a_3 may include a latch circuit (LAT) 37a_3_1 and a flip-flop (FF) 37a_3_2. The latch circuit 37a_3_1 may output a second pre-shifted phase pulse PRE_PB_SFT by shifting the second internal pulse IPULB by one half cycle of the second phase clock CLKB. The flip-flop 37a_3_2 may output the second shifted phase pulse PB_SFT by shifting the second pre-shifted phase pulse PRE_PB_SFT by one cycle of the second phase clock CLKB.

Figure 8:
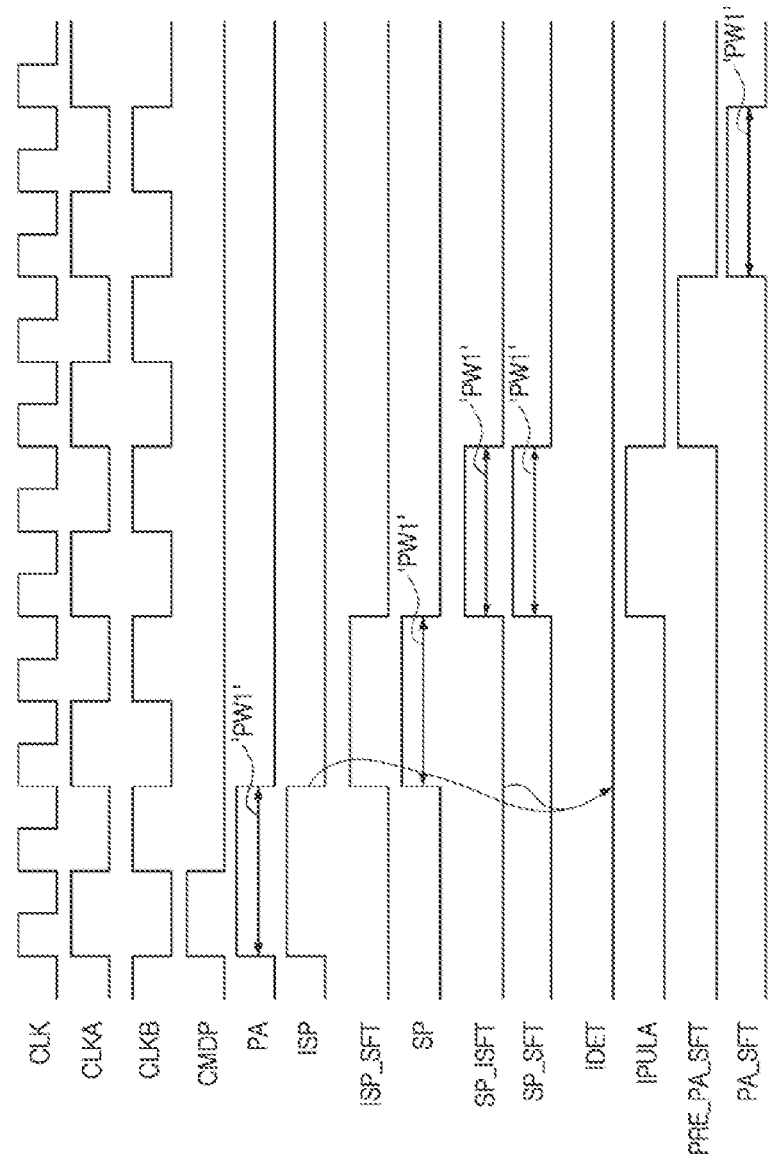
FIGS. 8 and 9 are timing diagrams for describing the operation of the electronic device illustrated in FIG. 1.

FIG. 8 is a timing diagram for describing the operation of the electronic device 1 illustrated in FIG. 1 when the operation control pulse CMDP is synchronized with the first phase clock CLKA. Referring to FIG. 8, the phase clock generation circuit 10a may generate the first phase clock CLKA and the second phase clock CLKB having different phases by dividing the frequency of the clock CLK.

The phase pulse generation circuit 20a may generate the first phase pulse PA having a predetermined pulse width PW1 when the operation control pulse CMDP is synchronized with the first phase clock CLKA.

The synthesized pulse generation circuit 31a may generate the internal synthesized pulse ISP from the first phase pulse PA. The synthesized pulse generation circuit 31a may generate the shifted internal synthesized pulse ISP_SFT (see FIG. 3) by shifting the internal synthesized pulse ISP in synchronization with the first phase clock CLKA. The synthesized pulse generation circuit 31a may generate the synthesized pulse SP having the predetermined pulse width PW1 from the shifted internal synthesized pulse ISP_SFT (see FIG. 3) on the basis of the deactivated phase-shifted pulse PB_A (see FIG. 3).

The shifted synthesized pulse generation circuit 33a may output the internal shifted synthesized pulse SP_ISFT having the predetermined pulse width PW1 by shifting the synthesized pulse SP in synchronization with the first phase clock CLKA. The shifted synthesized pulse generation circuit 33a may output the internal shifted synthesized pulse SP_ISFT as the shifted synthesized pulse SP_SFT.

The pulse width detection circuit 35a may deactivate the internal detection signal IDET (see FIGS. 5 and 6) when the internal shifted synthesized pulse SP_ISFT is deactivated during a period in which the internal synthesized pulse ISP is activated. The pulse width detection circuit 35a may deactivate the detection signal DET on the basis of the deactivated internal detection signal IDET (see FIGS. 5 and 6).

The shifted pulse output circuit 37a may output the shifted synthesized pulse SP_SFT as the first internal pulse IPULA (see FIG. 7) on the basis of the deactivated detection signal DET. The shifted pulse output circuit 37a may shift the first internal pulse IPULA (see FIG. 7) in synchronization with the first phase clock CLKA, and thereby, may sequentially generate the first pre-shifted phase pulse PRE_PA_SFT (see FIG. 7) and the first shifted phase pulse PA_SFT having the predetermined pulse width PW1.

Figure 9:
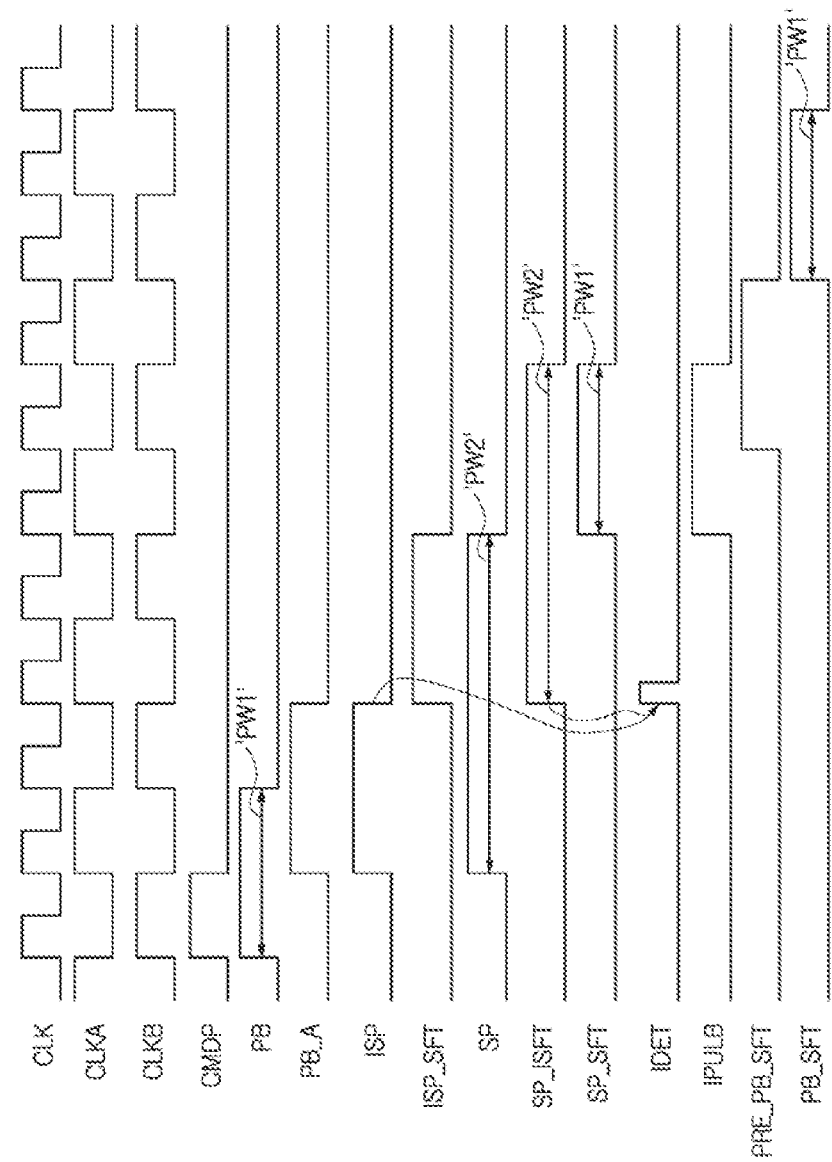

FIG. 9 is a timing diagram for describing the operation of the electronic device 1 illustrated in FIG. 1 when the operation control pulse CMDP is synchronized with the second phase clock CLKB. Referring to FIG. 9, the phase clock generation circuit 10a may generate the first phase clock CLKA and the second phase clock CLKB having different phases by dividing the frequency of the clock CLK.

The phase pulse generation circuit 20a may generate the second phase pulse PB having the predetermined pulse width PW1 when the operation control pulse CMDP is synchronized with the second phase clock CLKB.

The synthesized pulse generation circuit 31a may output the second phase pulse PB as the phase-shifted pulse PB_A (see FIG. 3) in synchronization with the first phase clock CLKA. The synthesized pulse generation circuit 31a may generate the internal synthesized pulse ISP from the phase-shifted pulse PB_A (see FIG. 3). The synthesized pulse generation circuit 31a may generate the shifted internal synthesized pulse ISP_SFT (see FIG. 3) by shifting the internal synthesized pulse ISP in synchronization with the first phase clock CLKA. The synthesized pulse generation circuit 31a may generate the synthesized pulse SP having a pulse width PW2 different from the predetermined pulse width PW1 by synthesizing the phase-shifted pulse PB_A (see FIG. 3) and the shifted internal synthesized pulse ISP_SFT (see FIG. 3).

The shifted synthesized pulse generation circuit 33a may output the internal shifted synthesized pulse SP_ISFT having the pulse width PW2 by shifting the synthesized pulse SP in synchronization with the first phase clock CLKA. The shifted synthesized pulse generation circuit 33a may generate the shifted synthesized pulse SP_SFT by adjusting the pulse width of the internal shifted synthesized pulse SP_ISFT to the predetermined pulse width PW1.

The pulse width detection circuit 35a may activate the internal detection signal IDET (see FIGS. 5 and 6) when the internal shifted synthesized pulse SP_ISFT is activated during a period in which the internal synthesized pulse ISP is activated. The pulse width detection circuit 35a may activate the detection signal DET on the basis of the activated internal detection signal IDET (see FIGS. 5 and 6).

The shifted pulse output circuit 37a may output the shifted synthesized pulse SP_SFT as the second internal pulse IPULB (see FIG. 7) on the basis of the activated detection signal DET. The shifted pulse output circuit 37a may shift the second internal pulse IPULB (see FIG. 7) in synchronization with the second phase clock CLKB, and thereby, may sequentially generate the second pre-shifted phase pulse PRE_PB_SFT (see FIG. 7) and the second shifted phase pulse PB_SFT having the predetermined pulse width PW1.

Figure 10:
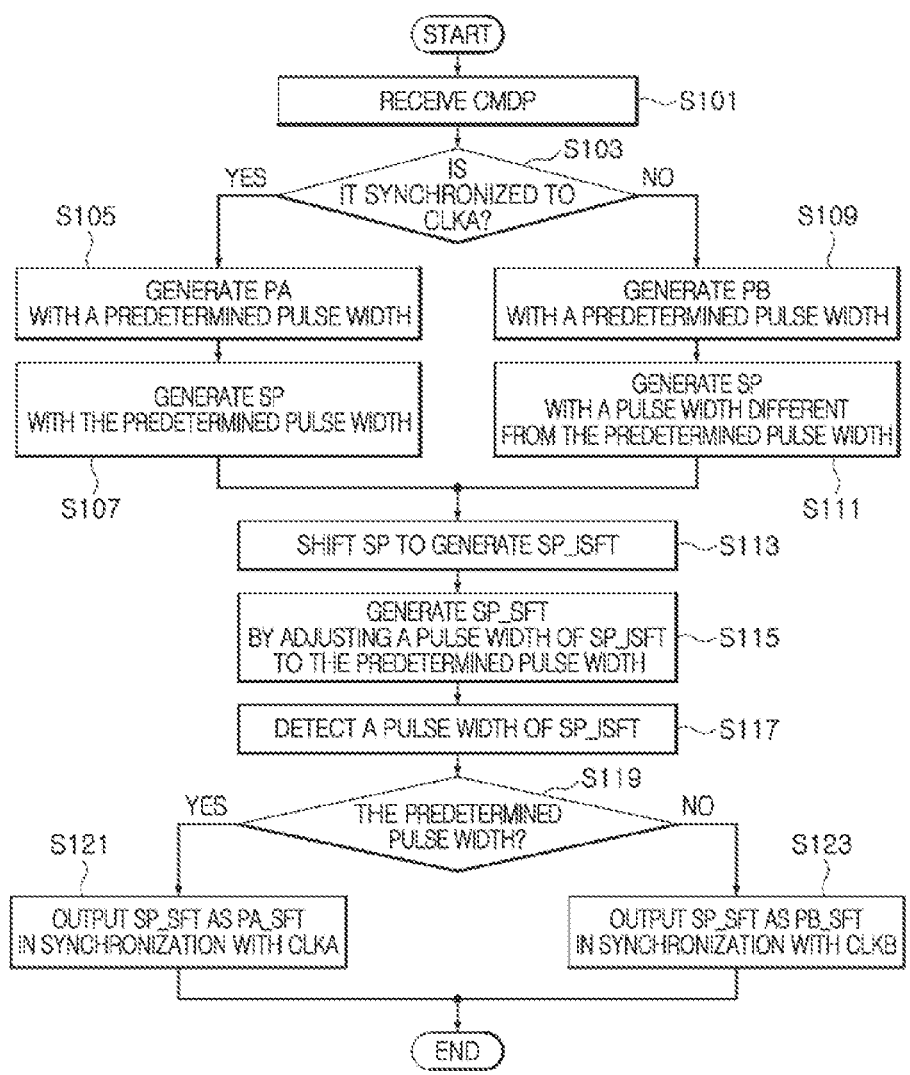
FIG. 10 is a flowchart for describing the operation of the electronic device illustrated in FIG. 1.

FIG. 10 is a flowchart for describing the operation of the electronic device 1 illustrated in FIG. 1.

The phase pulse generation circuit 20a receives the operation control pulse CMDP for controlling an internal operation (S101).

The phase pulse generation circuit 20a determines to which one of the first phase clock CLKA and the second phase clock CLKB the received operation control pulse CMDP is synchronized (S103).

When at S103, the operation control pulse CMDP is synchronized with the first phase clock CLKA, the phase pulse generation circuit 20a generates the first phase pulse PA having the predetermined pulse width (S105). The synthesized pulse generation circuit 31a generates the synthesized pulse SP having the predetermined pulse width, from the first phase pulse PA (S107).

When at S103, the operation control pulse CMDP is synchronized with the second phase clock CLKB, the phase pulse generation circuit 20a generates the second phase pulse PB having the predetermined pulse width (S109). The synthesized pulse generation circuit 31a generates the synthesized pulse SP having a pulse width different from the predetermined pulse width, from the second phase pulse PB (S111).

The shifted synthesized pulse generation circuit 33a generates the internal shifted synthesized pulse SP_ISFT by shifting the synthesized pulse SP (S113). The shifted synthesized pulse generation circuit 33a generates the shifted synthesized pulse SP_SFT by adjusting the pulse width of the internal shifted synthesized pulse SP_ISFT to the predetermined pulse width (S115).

The pulse width detection circuit 35a detects whether the pulse width of the internal shifted synthesized pulse SP_ISFT is the predetermined pulse width (S117 and S119).

When at S119, the pulse width of the internal shifted synthesized pulse SP_ISFT is the predetermined pulse width, the shifted pulse output circuit 37a outputs the shifted synthesized pulse SP_SFT as the first shifted phase pulse PA_SFT in synchronization with the first phase clock CLKA (S121).

When at S119, the pulse width of the internal shifted synthesized pulse SP_ISFT is different from the predetermined pulse width, the shifted pulse output circuit 37a outputs the shifted synthesized pulse SP_SFT as the second shifted phase pulse PB_SFT in synchronization with the second phase clock CLKB (S123).

Figure 11:
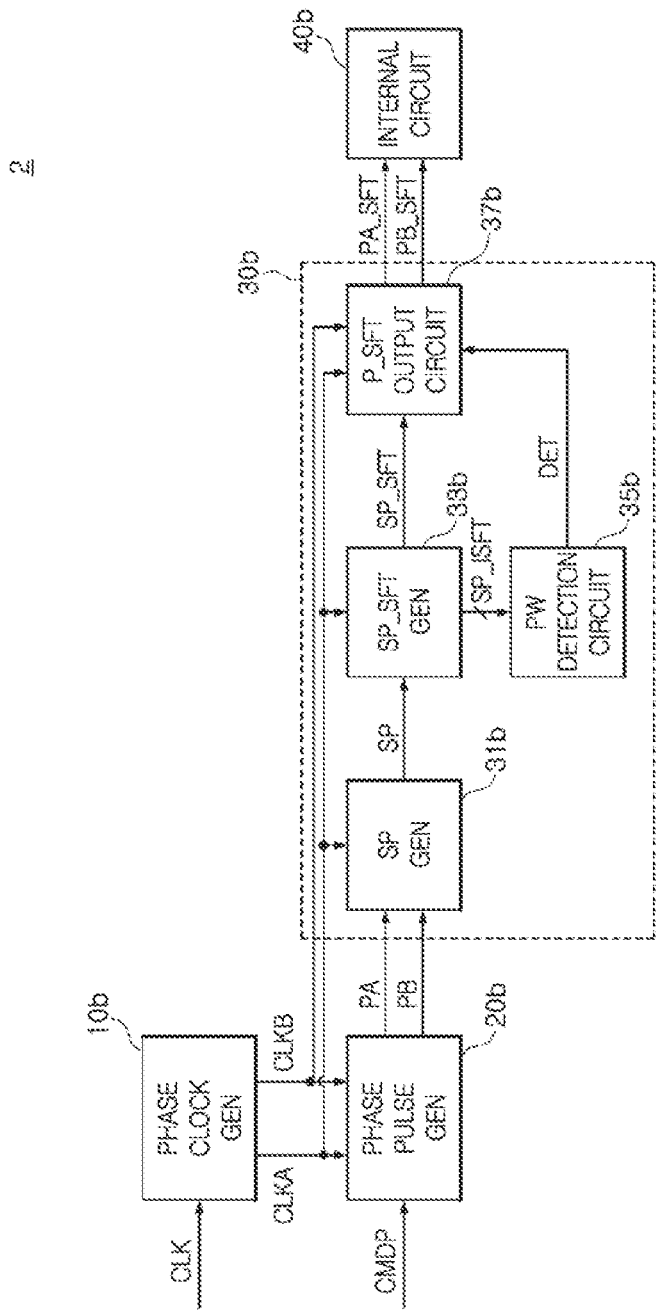
FIG. 11 is a block diagram illustrating a configuration of an electronic device in accordance with another example of the present disclosure.

FIG. 11 is a block diagram illustrating a configuration of an electronic device 2 in accordance with another example of the present disclosure. As illustrated in FIG. 11, the electronic device 2 may include a phase clock generation circuit (PHASE CLOCK GEN) 10b, a phase pulse generation circuit (PHASE PULSE GEN) 20b, a shift register 30b, and an internal circuit (INTERNAL CIRCUIT) 40b.

The phase clock generation circuit 10b may generate a first phase clock CLKA and a second phase clock CLKB on the basis of a clock CLK. The phase clock generation circuit 10b may generate the first phase clock CLKA and the second phase clock CLKB by dividing the frequency of the clock CLK. The first phase clock CLKA and the second phase clock CLKB may have different phases. The phase clock generation circuit 10b may be implemented in the same manner as the phase clock generation circuit 10a illustrated in FIG. 1.

The phase pulse generation circuit 20b may generate a first phase pulse PA and a second phase pulse PB from an operation control pulse CMDP on the basis of the first phase clock CLKA and the second phase clock CLKB. The phase pulse generation circuit 20b may generate one of the first phase pulse PA and the second phase pulse PB in synchronization with any one of the first phase clock CLKA and the second phase clock CLKB depending on the phase of the operation control pulse CMDP. The first phase pulse PA and the second phase pulse PB may have the same predetermined pulse width. The phase pulse generation circuit 20b may be implemented in the same manner as the phase pulse generation circuit 20a illustrated in FIG. 1.

The shift register 30b may include a synthesized pulse generation circuit (SP GEN) 31b, a shifted synthesized pulse generation circuit (SP_SFT GEN) 33b, a pulse width detection circuit (PW DETECTION CIRCUIT) 35b, and a shifted pulse output circuit (P_SFT OUTPUT CIRCUIT) 37b. The shift register 30b may generate a first shifted phase pulse PA_SFT and a second shifted phase pulse PB_SFT from the first phase pulse PA and the second phase pulse PB on the basis of the first phase clock CLKA and the second phase clock CLKB. The shift register 30b may output the first shifted phase pulse PA_SFT synchronized with the first phase clock CLKA, by shifting the first phase pulse PA. The shift register 30b may output the second shifted phase pulse PB_SFT synchronized with the second phase clock CLKB, by shifting the second phase pulse PB.

The synthesized pulse generation circuit 31b may generate a synthesized pulse SP from one of the first phase pulse PA and the second phase pulse PB in synchronization with the first phase clock CLKA. The synthesized pulse generation circuit 31b may generate the synthesized pulse SP having a different pulse width depending on which one of the first phase pulse PA and the second phase pulse PB is inputted. The configuration and operation method of the synthesized pulse generation circuit 31b are implemented in the same manner as those of the synthesized pulse generation circuit 31a illustrated in FIG. 1, and therefore, detailed description thereof will be omitted herein.

The shifted synthesized pulse generation circuit 33b may generate an internal shifted synthesized pulse SP_ISFT and a shifted synthesized pulse SP_SFT from the synthesized pulse SP in synchronization with the first phase clock CLKA. The internal shifted synthesized pulse SP_ISFT may include first to Nth internal shifted synthesized pulses SP_ISFT<1:N>. The shifted synthesized pulse generation circuit 33b may sequentially generate the first to Nth internal shifted synthesized pulses SP_ISFT<1:N> by consecutively shifting the synthesized pulse SP in synchronization with the first phase clock CLKA. The shifted synthesized pulse generation circuit 33b may generate the shifted synthesized pulse SP_SFT by adjusting the pulse width of the Nth internal shifted synthesized pulse SP_ISFT<N> to the predetermined pulse width. The configuration and operation method of the shifted synthesized pulse generation circuit 33b will be described later in detail with reference to FIG. 12.

The pulse width detection circuit 35b may detect the pulse width of the Nth internal shifted synthesized pulse SP_ISFT<N> on the basis of any one of the first to (N−1)th internal shifted synthesized pulses SP_ISFT<1:N−1>, and thereby, may generate a detection signal DET. For example, the pulse width detection circuit 35b may generate the detection signal DET by detecting whether the Nth internal shifted synthesized pulse SP_ISFT<N> is activated during a period in which the (N−2)th internal shifted synthesized pulse SP_ISFT<N−2> is activated. The configuration and operation method of the pulse width detection circuit 35b may be implemented in the same manner as those of the pulse width detection circuit 35a_1 illustrated in FIG. 5 or the pulse width detection circuit 35a_2 illustrated in FIG. 6.

The shifted pulse output circuit 37b may output the shifted synthesized pulse SP_SFT as one of the first shifted phase pulse PA_SFT and the second shifted phase pulse PB_SFT on the basis of the detection signal DET in synchronization with the first phase clock CLKA and the second phase clock CLKB. When the detection signal DET is deactivated, the shifted pulse output circuit 37b may output the shifted synthesized pulse SP_SFT as the first shifted phase pulse PA_SFT in synchronization with the first phase clock CLKA. When the detection signal DET is activated, the shifted pulse output circuit 37b may output the shifted synthesized pulse SP_SFT as the second shifted phase pulse PB_SFT in synchronization with the second phase clock CLKB. The configuration and operation method of the shifted pulse output circuit 37b are implemented in the same manner as those of the shifted pulse output circuit 37a illustrated in FIG. 1, and therefore, detailed description thereof will be omitted herein.

The internal circuit 40b may perform various internal operations on the basis of the first shifted phase pulse PA_SFT and the second shifted phase pulse PB_SFT.

Figure 12:
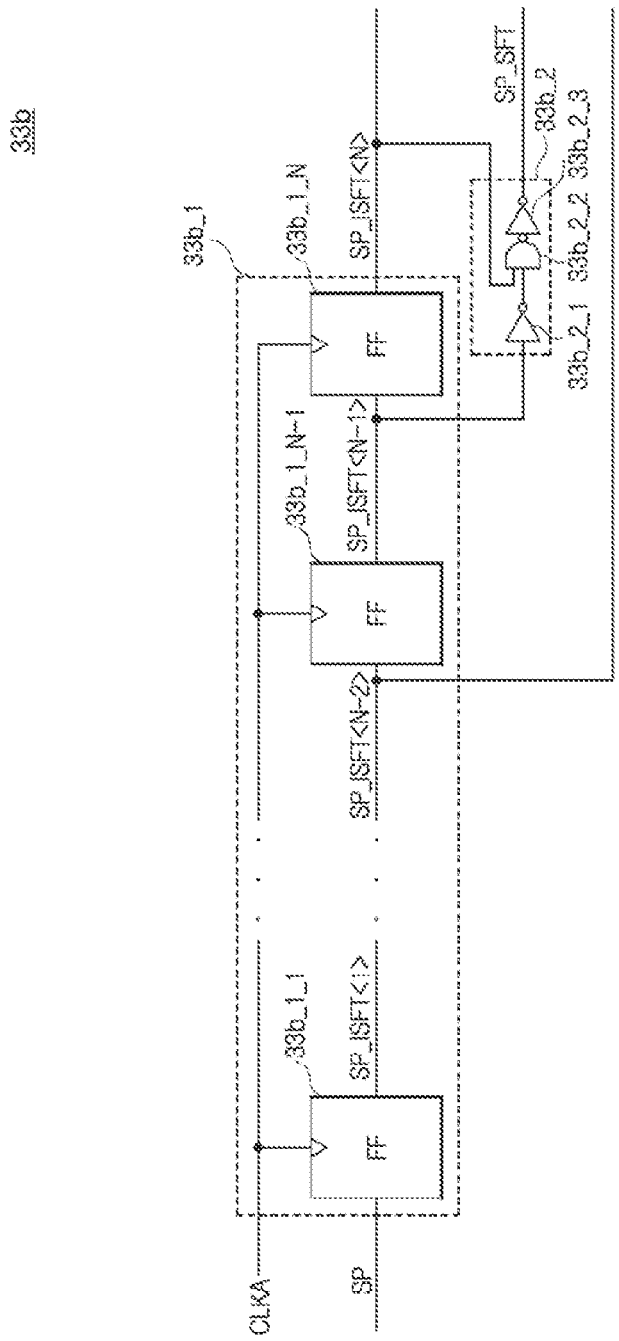
FIG. 12 is a circuit diagram illustrating an example of a shifted synthesized pulse generation circuit included in a shift register illustrated in FIG. 11.

FIG. 12 is a circuit diagram illustrating an example of the shifted synthesized pulse generation circuit 33b included in the shift register 30b illustrated in FIG. 11. As illustrated in FIG. 12, the shifted synthesized pulse generation circuit 33b may include a shift circuit 33b_1 and a pulse width adjustment circuit 33b_2.

The shift circuit 33b_1 may sequentially generate the first to Nth internal shifted synthesized pulses SP_ISFT<1:N> by shifting the synthesized pulse SP in synchronization with the first phase clock CLKA. The shift circuit 33b_1 may include a plurality of flip-flops 33b_1_1 to 33b_1_N which consecutively shift the synthesized pulse SP each by one cycle of the first phase clock CLKA.

The pulse width adjustment circuit 33b_2 may output the shifted synthesized pulse SP_SFT by adjusting the pulse width of the Nth internal shifted synthesized pulse SP_ISFT<N> to the predetermined pulse width on the basis of the (N−1)th internal shifted synthesized pulse SP_ISFT<N−1>. For example, the pulse width adjustment circuit 33b_2 may adjust the pulse width of the Nth internal shifted synthesized pulse SP_ISFT<N>, by blocking the input of the Nth internal shifted synthesized pulse SP_ISFT<N> during a period in which the (N−1)th internal shifted synthesized pulse SP_ISFT<N−1> has a logic high level and by outputting the Nth internal shifted synthesized pulse SP_ISFT<N> as the shifted synthesized pulse SP_SFT during a period in which the (N−1)th internal shifted synthesized pulse SP_ISFT<N−1> has a logic low level. The pulse width adjustment circuit 33b_2 may be implemented with inverters 33b_2_1 and 33b_2_3 and a NAND gate 33b_2_2.

As is apparent from the above description, according to the examples of the present disclosure, by synthesizing input pulses to share shift registers which shift input pulses having different phases and shifting a synthesized pulse by adjusting a pulse width thereof according to a phase of an input pulse to distinguish the phase of the input pulse, it is possible to reduce an area and power consumed by the shift register.

Although some examples of the present teachings have been disclosed for illustrative purposes, those skilled in the art will appreciate that various modifications, additions, and substitutions are possible, without departing from the scope and spirit of the present teachings as defined in the accompanying claims.

What is claimed is:

1. A shift register comprising:
a synthesized pulse generation circuit configured to generate a synthesized pulse having a different pulse width according to which one of a first phase pulse and a second phase pulse is inputted;
a shifted synthesized pulse generation circuit configured to generate an internal shifted synthesized pulse and a shifted synthesized pulse from the synthesized pulse;
a pulse width detection circuit configured to generate a detection signal by detecting a pulse width of the internal shifted synthesized pulse; and
a shifted pulse output circuit configured to output the shifted synthesized pulse as one of a first shifted phase pulse and a second shifted phase pulse based on the detection signal.

2. The shift register according to claim 1, wherein:
the synthesized pulse generation circuit is configured to generate the synthesized pulse from one of the first phase pulse synchronized with a first phase clock and the second phase pulse synchronized with a second phase clock; and
the first phase pulse and the second phase pulse have the same predetermined pulse width.

3. The shift register according to claim 2, wherein the synthesized pulse generation circuit is configured to output one of the first phase pulse and the second phase pulse as the synthesized pulse in synchronization with the first phase clock.

4. The shift register according to claim 1, wherein the synthesized pulse generation circuit is configured to:
generate the synthesized pulse having a predetermined pulse width when the first phase pulse is inputted; and
generate the synthesized pulse having a pulse width different from the predetermined pulse width when the second phase pulse is inputted.

5. The shift register according to claim 1, wherein the shifted synthesized pulse generation circuit is configured to:
generate the internal shifted synthesized pulse by shifting the synthesized pulse; and
generate the shifted synthesized pulse by adjusting a pulse width of the internal shifted synthesized pulse.

6. The shift register according to claim 5, wherein the shifted synthesized pulse generation circuit comprises at least one flip-flop which shifts the synthesized pulse in synchronization with the first phase clock.

7. The shift register according to claim 5, wherein the shifted synthesized pulse generation circuit is configured to output the shifted synthesized pulse by adjusting a pulse width of the internal shifted synthesized pulse to the predetermined pulse width.

8. The shift register according to claim 1, wherein the pulse width detection circuit is configured to activate the detection signal when a pulse width of the internal shifted synthesized pulse is different from a predetermined pulse width of the first phase pulse and the second phase pulse.

9. The shift register according to claim 1, wherein the shifted pulse output circuit is configured to:

output the shifted synthesized pulse as the first shifted phase pulse in synchronization with the first phase clock when the detection signal is deactivated; and output the shifted synthesized pulse as the second shifted phase pulse in synchronization with the second phase clock when the detection signal is activated.

10. An electronic device comprising:
a phase pulse generation circuit configured to generate one of a first phase pulse and a second phase pulse depending on a phase of an operation control pulse; and
a shift register configured to:
generate a synthesized pulse having a different pulse width according to which one of the first phase pulse and the second phase pulse is inputted;
generate an internal shifted synthesized pulse by shifting the synthesized pulse; and
generate one of a first shifted phase pulse and a second shifted phase pulse depending on a pulse width of the internal shifted synthesized pulse.

11. The electronic device according to claim 10, wherein the phase pulse generation circuit is configured to:
generate the first phase pulse when the operation control pulse is synchronized with a first phase clock; and
generate the second phase pulse when the operation control pulse is synchronized with a second phase clock.

12. The electronic device according to claim 11, further comprising a phase clock generation circuit configured to divide a frequency of a clock to generate the first phase clock and the second phase clock having different phases.

13. The electronic device according to claim 10, wherein the shift register is configured to:
output the first shifted phase pulse synchronized with the first phase clock, by shifting the first phase pulse synchronized with the first phase clock; and
output the second shifted phase pulse synchronized with the second phase clock, by shifting the second phase pulse synchronized with the second phase clock.

14. The electronic device according to claim 10, wherein the shift register is configured to:
generate the synthesized pulse having a predetermined pulse width when the first phase pulse is inputted; and
generate the synthesized pulse having a pulse width different from the predetermined pulse width when the second phase pulse is inputted,
wherein each of the first phase pulse and the second phase pulse has the predetermined pulse width.

15. The electronic device according to claim 10, wherein the shift register is configured to generate one of the first phase pulse and the second phase pulse as the synthesized pulse in synchronization with the first phase clock.

16. The electronic device according to claim 15, wherein the shift register comprises at least one flip-flop to shift the synthesized pulse in synchronization with the first phase clock.

17. The electronic device according to claim 10, wherein the shift register is configured to:
generate a shifted synthesized pulse by adjusting a pulse width of the internal shifted synthesized pulse; and
output the shifted synthesized pulse as one of the first shifted phase pulse and the second shifted phase pulse according to a result of detecting a pulse width of the internal shifted synthesized pulse.

18. The electronic device according to claim 17, wherein the shift register is configured to generate the shifted synthesized pulse by adjusting a pulse width of the internal shifted synthesized pulse to the predetermined pulse width.

19. The electronic device according to claim 17, wherein the shift register is configured to output the shifted synthesized pulse as the first shifted phase pulse in synchronization with the first phase clock when a pulse width of the internal shifted synthesized pulse is the same as the predetermined pulse width.

20. The electronic device according to claim 17, wherein the shift register is configured to output the shifted synthesized pulse as the second shifted phase pulse in synchronization with the second phase clock when a pulse width of the internal shifted synthesized pulse is different from the predetermined pulse width.

* * * * *